United States Patent
Chen et al.

(10) Patent No.: US 6,927,076 B2
(45) Date of Patent: Aug. 9, 2005

(54) METHOD FOR RECOVERING A PLASMA PROCESS

(75) Inventors: Shi-Rong Chen, Changhua (TW);
Yu-Wen Fang, Bade (TW);
Ching-Shan Lu, Taichung (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 494 days.

(21) Appl. No.: 10/264,517

(22) Filed: Oct. 5, 2002

(65) Prior Publication Data

US 2004/0067645 A1 Apr. 8, 2004

(51) Int. Cl.[7] ................ H01L 21/00; H01L 21/302; H01L 21/3605
(52) U.S. Cl. ............... 438/5; 438/7; 438/9; 438/10; 438/706; 438/710
(58) Field of Search ............... 438/5, 7, 9, 10, 438/706, 710

(56) References Cited

U.S. PATENT DOCUMENTS 6,582,618 B1 * 6/2003 Toprac et al. ............... 216/59
6,745,095 B1 * 6/2004 Ben-Dov et al. ........... 700/121

* cited by examiner

Primary Examiner—Nadine G. Norton
Assistant Examiner—Lynette T. Umez-Eronini
(74) Attorney, Agent, or Firm—Tung & Associates

(57) ABSTRACT

A method for automated monitoring and controlling of a semiconductor wafer plasma process including performing a plasma process in a plasma processing system to treat a semiconductor process wafer according to a first plasma process recipe; collecting plasma process parameters including at least an RF power and a plasma process time at pre-determined time intervals; and, storing the plasma process parameters including pre-process plasma processing system parameters according to a selectively queryable database to create a plasma process history such that upon abortion of the plasma process the plasma process history may be selectively retrieved to determine a second plasma process recipe to complete the plasma process.

20 Claims, 1 Drawing Sheet

METHOD FOR RECOVERING A PLASMA PROCESS

FIELD OF THE INVENTION

This invention generally relates to plasma processes and more particularly to a method for real-time monitoring and storage of plasma process parameters to allow recovery and resumption of a plasma process following shut down of the plasma process.

BACKGROUND OF THE INVENTION

In semiconductor fabrication, various layers of insulating material, semiconducting material and conducting material are formed to produce a multilayer semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers may be accomplished using various fabrication techniques including oxidation, implantation, deposition, epitaxial growth of silicon, lithography, etching, and planarization.

One important etching procedure for forming semiconductor features includes reactive ion etching (RIE) performed by a plasma of reactive ions. In the field of plasma etching, various processing parameters including, for example, RF power, RF bias, pressure, gas flow rate, temperature, and vacuum conditions are pre-determine in order to accomplish a particular plasma etching process. In addition, many plasma etching processes are pre-programmed to follow a series of steps for predetermined time periods also referred to as a process recipe, where the processing parameters may be altered at each step to achieve a desired etching result.

In addition, the plasma processing system frequently includes an endpoint detection means to determine an etching endpoint. For example, in dry etching the etching process frequently does not have good selectivity to an underlying material layer making an endpoint detection system necessary to avoid overetching of an underlying layer. Endpoint detection systems monitor parameters such as a change in the etch rate, the type of etch products, or a change in the active reactants in the gas discharge. For example, and optical emission spectroscopy (OES) has been widely used for endpoint detection by monitoring the intensity of wavelengths of either reactive species or etch products. More specifically, during an RIE process, plasma discharge materials, such as etchant, neutral, and reactive ions in the plasma, are continuously excited by electrons and collisions, giving off emissions ranging from ultraviolet to infrared radiation. An optical emission spectrometer diffracts this light into its component wavelengths and determines the intensity at a particular wavelength. Since each species emits light at a wavelength characteristic only of that species, it is possible to associate a certain wavelength with a particular species, and to use this information to detect an etching endpoint.

Also useful for monitoring reactants and products in a plasma etching process includes mass spectroscopy, where a molecule is broken into fragments and then analyzed typically using a magnetic field to determine the mass of the constituent fragments.

In forming a feature in a layer of material in a multilayer semiconductor device, an etching process typically etches away one type of material included in one layer of the device until another different layer of material, which typically has a low selectivity to etching, is reached, for example, an etch stop layer. Since the etch stop layer is typically a different material having a low reactivity with the reactive ion species, a discernible change in either or both the concentration of reactive ion species and the reactively etched species may be easily observed. Since the concentration of given plasma species is proportional to an emitted wavelength of light, the concentration of a given species may be tracked by monitoring the intensity at a given wavelength.

One problem with end-point detection using OES or any other plasma species monitoring method occurs where no change in material such as a material interface is present during the etching process thereby providing no readily discernable change in reactive species or reactively etched (product) species. There are several applications, however, where no material interface is present, yet a particular feature etching depth is required, for example, a trench or via etching depth a silicon or dielectric material.

Several approaches have been proposed to overcome the lack of a clearly discernible material interface including tracking the amount of either or both reactants and plasma etching product species present as a function of etching time during the etching process. For example, statistical techniques typically single out one or more individual plasma species components to monitor over time where the selection of the components is determined by statistical analysis of previous etching procedures. Alternatively, particular etching processes without a clearly discernible material interface rely on pre-determine time period for etching under particular plasma processing parameters.

One problem with the prior art plasma processing systems is the failure to provide a mechanism for plasma processing recovery in the event of an unexpected shutdown of the equipment, for example in the event of a power failure, hardware, or software failure. For example, in prior art plasma processing systems it is frequently difficult if not impractical to resume a plasma process, for example plasma etching where a clearly discernable interface is absent. For example, to resume a plasma process it is necessary to know the precise history of previous plasma processing conditions associated with a particular plasma etch recipe including time at a particular RF power as well as other processing and plasma species monitoring parameters. Prior art plasma processing systems have not provided a readily accessible and operable means to resume a plasma process, for example, a plasma etch process, following an unexpected shutdown of the process. As a result, process wafers must be scrapped in the event of an unexpected shutdown due to the impracticality of resuming a plasma process, particularly an etch process where a clearly discernable etching interface is absent.

These and other shortcomings demonstrate a need in the semiconductor processing art to develop a method for tracking a plasma process including a plasma etch process such that the plasma process may be easily resumed following a process shutdown.

It is therefore an object of the invention to provide a method for tracking a plasma process including a plasma etch process such that the plasma process may be easily resumed following a process shutdown while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for automated monitoring and controlling of a semiconductor wafer plasma process including performing a plasma process in a plasma processing system to treat a semiconductor process wafer according to a first plasma process recipe; collecting plasma process parameters including at least an RF power and a plasma process time at pre-determined time intervals; and, storing the plasma process parameters including pre-process plasma processing system parameters according to a selectively queryable database to create a plasma process history such that upon abortion of the plasma process the plasma process history may be selectively retrieved to determine a second plasma process recipe to complete the plasma process.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

In the method according to the present invention, although particularly advantageous in a plasma etch process, it will be appreciated that the method of the present invention may be advantageously applied to any plasma process where a readily accessible database of a plasma processing history may be advantageously used to resume a plasma process recipe following a premature termination (abortion) of the process. In addition, although the method of the present invention is explained by reference to optical emission spectra, it will be appreciated that the method of the present invention may be used with any plasma species monitoring system capable of tracking a concentration of reactant and product species over time in an plasma etch process. Further, it will be appreciated that the method of the present invention may be used where no plasma species monitoring system is utilized, for example where the plasma etch process is carried out with a predetermined processing parameter recipe for a predetermined time period.

In a first embodiment of the invention a semiconductor process wafer is provided in a plasma processing system for carrying out a plasma process. A plasma process is then begun where independent variables associated with plasma processing conditions and dependent variables associated with the plasma process (e.g., processing time and plasma species concentrations) are collected at pre-determined time intervals during the plasma process and database objects including independent and dependent variables associated with a particular plasma process are formed and stored in a selectively queryable database such that upon subsequent database query a processing history associated with a particular plasma process recipe and plasma processing system is selectively retrieved. Based on the database query, and optional comparison to a model plasma process history, new plasma processing recipe is determined for completing the plasma process to approximate the original plasma process.

Figure 1:
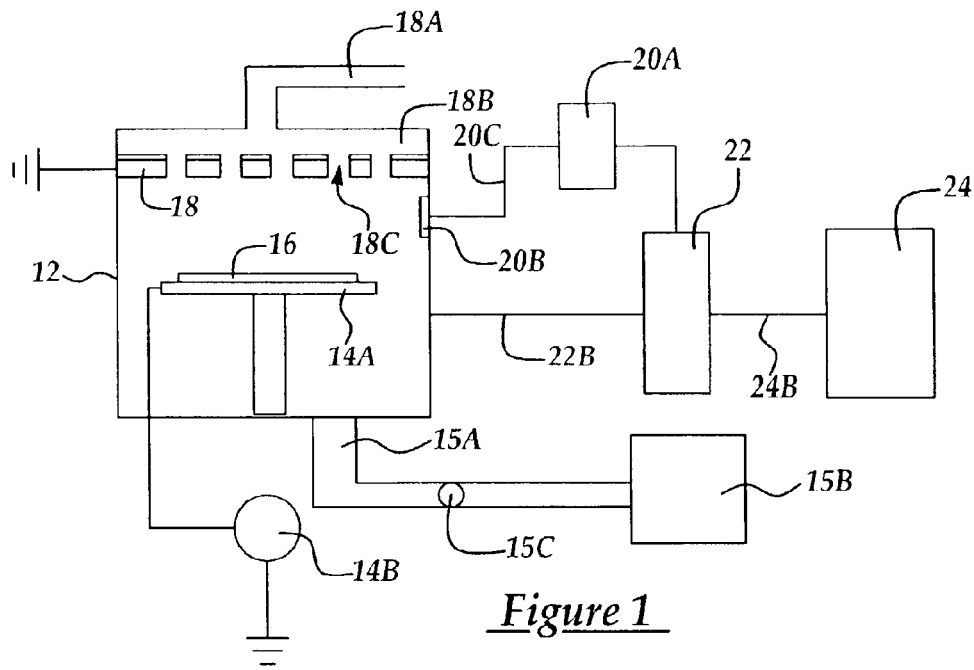
FIG. 1 is a schematic of an exemplary plasma processing apparatus for practicing the method of the present invention.

For example, referring to FIG. 1 is shown a schematic of an exemplary apparatus for implementation of the present invention. For example, a parallel-plate RIE reactor having a chamber 12, a powered electrode 14A supporting process wafer 16, and a grounded electrode 18 disposed in an upper portion of the chamber 12. Gas feed line 18A and gas manifold 18B including gas openings e.g., 18C provide reactant gases to the chamber 14 for forming a plasma. Powered electrode 14A is supplied by RF generator 14B. A plasma species monitoring means, for example a spectrometer assembly 20A, for example, including scanning-type spectrometers and solid state spectrometers, is disposed outside the chamber 12 and is in optical signal communication with a window 20B, for example, through a fiber optic cable assembly 20C. It will be appreciated that more than one spectrometer including fiber optic assemblies may be used to monitor a plasma condition, for example, optical emissions of reactant and/or plasma species. A vacuum line 15A is in gaseous communication with a pumping means 15B including a throttle valve 15C for adjusting a pumping speed to control the chamber pressure. A system controller 22 is in electrical communication with sensors and means for controlling independently variable process parameters, (independent process variables), including for example, RF power, RF bias, RF frequency, gas flow rates, wafer temperature, chamber pressure, and optionally electrode position (conceptually shown by single communication line 22B). The system controller 22 is preferably in communication with a server 24 (conceptually shown by communication line 24B) including at least a computer readable storage media and a processor for processing computer readable instructions in the form of a computer program. The independent process variables are preferably provided with a means for remotely altering the process parameters, for example by instrument control communication interfaces including for example, IEEE-488, GP-IB, RS-232 communication hardware and protocol in communication with controller 22. It will be appreciated that wireless communication protocol and hardware may be used as well.

In an exemplary embodiment, independent process variables are each provided with one or more sensors in communication with controller 22 which are associated in controller 22 with a plasma process time according to a particular plasma process recipe. The plasma process recipe may wholly or partially be stored in the server memory or the controller memory. By the term 'process recipe' is meant a series of instructions for controlling independent process variables at pre-determined set points for a pre-determined time period or for an indefinite time period according to a monitored plasma condition, for example, a plasma species concentration. For example dependent process variables include a process time associated with a particular process recipe step, overall recipe process time, and plasma condition, for example spectra collected by an optical emission assembly.

For example, system controller 22 is provided for collecting measured plasma process parameters including independent and dependent variable measurement values (plasma process parameters) at predetermined time intervals. Preferably, the predetermined time interval may be varied between about 0.5 seconds and 30 seconds. The measurement values are then associated with the process time and the process recipe step, for example, temporarily storing the collected data (measurement values) in a memory cache prior to transfer to a remote server 24 for incorporation and storage into a selectively queryable database. By the term 'selectively queryable database' is meant that selected process parameter data representative of a process history associated with a particular plasma process system may be retrieved and displayed in response to a selective database query, for example as in a relational database. The server 24 is preferably in selective communication with remotely disposed user interfaces (not shown) including graphical user interfaces where the database may be queried by a user and displayed in the form of pre-determined graphically arranged data relationships or in the form of a table. The sever also preferably provides interactive access to process control programs (process recipes) to allow user manipulation and alteration of process control variables such as independent and process variables including a predetermined process recipe step process time. For example the process control programs may include batch operation mode and real-time interactive operation mode where independent variable may be selectively altered or overridden in real time. It will be appreciated that the controller, server, and graphical user interface may be disposed remotely from one another or may be included in a combined configuration. Preferably, however, one or more servers are configured to serve a plurality of plasma process systems associated with one or more controllers.

In one embodiment, the server includes a computer program accessible in memory or computer readable media to automatically determine the plasma processing history of a terminated process including a decision tree for resuming and completing the process. For example, in one embodiment, following premature termination of the plasma process, the server is instructed to query a database including plasma process parameters associated with a particular plasma process and retrieve dependent and independent variables associated the plasma process prior to termination to for a plasma process history.

For example, in exemplary operation, upon premature termination (process abortion prior to completion of a plasma process or plasma process recipe step) for any cause including loss of power, the server, preferably including a backup power supply, is notified of the premature process termination by conventional error trapping routines. For example, preferably, the server periodically queries the controller to determine whether a process has been aborted. Upon being notified of a premature stoppage of a particular plasma process, the server queries the particular plasma processing system controller to instruct the controller to dump its memory cache of any collected but not yet transferred measurement data. For example, preferably the memory cache includes a temporary memory retaining means, to retain collected data up to the point of a power failure. Upon resumption of power, the server is notified of the power resumption status and queries the relational database to retrieve a plasma process history associated with a particular plasma process recipe and a particular plasma process system including pre-determined independent process variable set-points for pre-process conditions, such as chamber pressure, RF power off condition, gas flow off, and the like. Upon determining pre-process plasma processing system conditions (set-points) the sever issues instructions to reset the controller to a pre-process state and to set the plasma processing system to pre-process conditions. The server then queries the relational database (selectively queryable database) to determine a processing history and retrieve data values including the dependent variable parameters at premature termination, for example, processing time, and process recipe step associated with the particular process time, and optionally, including additional plasma condition parameters at termination, for example, plasma species concentrations or concentration ratios. The server then determines a new process recipe according to retrieved data values. For example, the server determines start-up (set-point) values of independent process variables, determines a new process recipe, and arranges the relational database to resume data collection including a marker identifying the new process recipe data and an associated process time including a corrected time value relating back to the terminated process to enable subsequent database queries to seamlessly (e.g., as if one continuous process) retrieve and display pre-termination together with post-termination data including an identifier with respect to the particular data type. After determining the new process recipe, the server may be instructed to implement the new process recipe without user intervention or await confirmation from a user who may manually override the new process recipe including altering independent variable start-up parameters, operating parameters, and process times for a particular process recipe step.

For example, in the case of a plasma etching recipe for a pre-determined process time at a particular RF power, the server queries the relational database to determine an RF power and processing time, optionally integrating the RF power over processing time prior to termination and compares the retrieved values to retrieved model values for a selected model etching process. For example, model process parameters are contained in a separately queryable or linked relational database. The server then, based on pre-determined algorithm determines a new process recipe, for example, the server determines a desired RF power and processing time (e.g., integrated RF power over processing time) for the new process recipe that when added to a pre-termination process recipe step RF power and process time, will approximate the model processing conditions to complete the pre-termination process recipe. It will be appreciated that subsequent processing recipe steps may remain the same if unaffected by a premature shutdown (termination or abortion).

In another embodiment, a processing recipe may include an iterative plasma process parameter adjustment recipe. For example, real time adjustments of processing parameters by the controller in response to server instructions based on a real time comparison of collected plasma species concentration to retrieved (database query) model plasma species concentration history for the particular process to determine plasma processing parameter adjustments according to a decision tree to approximate the model plasma conditions. For example in one embodiment, at least two plasma species measurements (e.g., monitored emission wavelengths) proportional to concentration are monitored and stored including, for example, a ratio of at least two plasma species measurements are associated with a processing time and compared in real time or near real time to a model process history. Based on a predetermined decision tree independent process variable set-points (plasma processing parameters) are altered. The plasma species measurements, for example spectra or intensity at a monitored wavelength, independent process variables, and altered plasma processing parameter set-points made in response to the iterative plasma process parameter adjustment recipe are all associated with a processing time and stored in a relational database associated with a particular plasma process system and process recipe. Following premature termination and re-setting the plasma process system to preprocess conditions, the server then queries the relational database to determine the pre-termination processing history including the process termination time and at least the most recent independent process variable set-points (plasma processing parameters) prior to termination. The server then determines new independent process variable parameter set-points and arranges for subsequent database queries for real time comparison (e.g., including an adjusted total process time for the terminated and the resumed processes) with the model process data to seamlessly correspond to processing history comparisons corresponding with the new process recipe.

For example, the a plasma condition including a measurement value proportional to a concentration, for example, a monitored plasma species emission spectra at one or more wavelengths, of at least one reactant and one product is monitored during a plasma etching process and the ratio of the concentration of the at least one reactant and one product calculated to determine a reactant-product concentration ratio. The collected emission spectra data including the reactant-product ratio is stored in a relational database together with associated plasma processing parameters including at least the RF power level and the processing time. Subsequently, following a power shutdown or aborted process, in a plasma etching recovery procedure, the emission spectra history including at least one reactant-product ratio history are selectively retrieved from the database and compared to a model reactant-product ratio history to determine the start-up plasma process parameters, for example plasma etch process parameters, required to resume an etching process recipe step to approximate the model history. The emission spectra history including at least one reactant-product ratio are subsequently compared with model plasma conditions at pre-determined time intervals to determine in-situ adjustment of the etching process parameters to approach the model plasma conditions.

Figure 2:
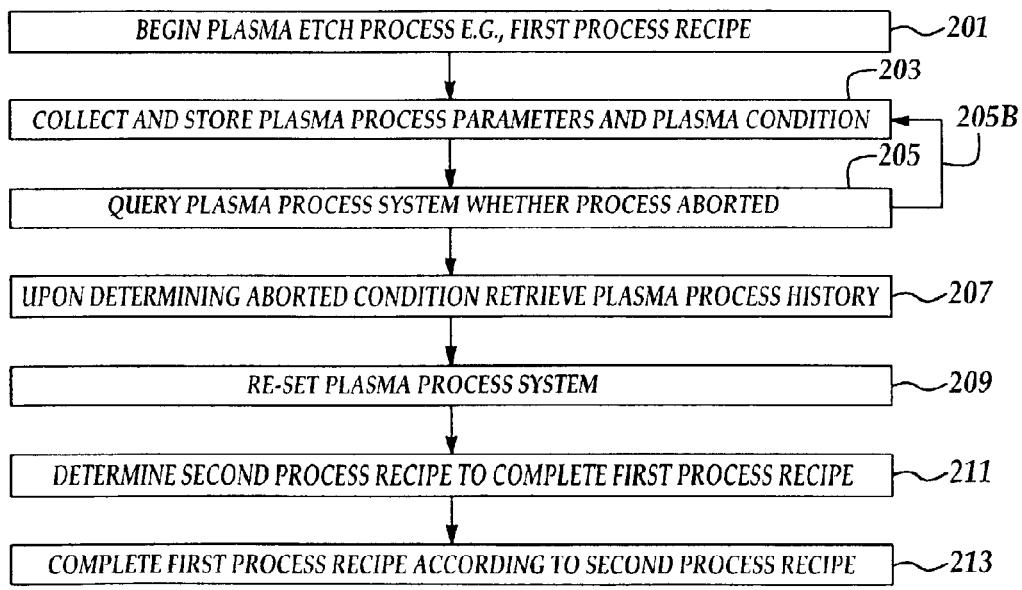
FIG. 2 is a process flow diagram including several embodiments of the present invention.

For example referring to FIG. 2 is a process flow diagram including several embodiments of the present invention. In process 201 a plasma etch process to anisotropically etch a semiconductor process wafer is begun according to a first plasma etch process recipe. In process 203, the plasma etch process parameters and plasma condition are collected at pre-determined time intervals and stored in at least one selectively queryable database to create the plasma etch process history. In process 205, the plasma process system is queried at selected time intervals to determine whether the plasma etch process has been aborted. As indicated by process directional arrow 205B process 205 is repeated periodically during the plasma process. In process 207, upon determination a plasma etch process has been aborted the plasma etch process history associated with the plasma processing system and the plasma etch recipe is retrieved from the database. In process 209, pre-process plasma processing system conditions are determined and re-set. In process 211, a second plasma etch process recipe is determined to approximate completion of the first plasma etch process recipe. In process 213, the second plasma etch process recipe is implemented to complete the first plasma etch process recipe.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for automated monitoring and controlling of a semiconductor wafer plasma process comprising the steps of:
   performing a plasma process in a plasma processing system to treat a semiconductor process wafer according to a first plasma process recipe;
   collecting plasma process parameters comprising at least an RF power and a plasma process time at pre-determined time intervals; and,
   storing the plasma process parameters including pre-process plasma processing system parameters according to a selectively queryable database to create a plasma process history such that upon abortion of the plasma process the plasma process history may be selectively retrieved to determine a second plasma process recipe to complete the plasma process.

2. The method of claim 1, wherein the plasma process comprises an anisotropic etching process.

3. The method of claim 1, wherein the plasma process parameters further comprise at least one of RF frequency, plasma chamber pressure, semiconductor wafer temperature, RF bias, plasma source gas flow rates, electrode position, and plasma species emission spectra.

4. The method of claim 1, wherein the step of storing the plasma process parameters comprises storing the plasma process parameters associated with an identifiable plasma process system and an identifiable plasma process recipe including a plasma process recipe step.

5. The method of claim 1, wherein the pre-determined time interval is from about 0.5 seconds to about 30 seconds.

6. The method of claim 1, further comprising the steps of;
   determining whether the plasma process has been aborted;
   upon determining an aborted plasma process selectively retrieving from the selectively queryable database the plasma process history to determine the second plasma process recipe; and,
   resuming the aborted plasma process.

7. The method of claim 6, wherein the second plasma process recipe comprises one of a pre-determined plasma processing time recipe and an iterative plasma process parameter adjustment recipe in response to a plasma species concentration.

8. The method of claim 6, wherein the step of selectively retrieving comprises determining the plasma process history comprising at least the RF power and the plasma process time.

9. The method of claim 7, wherein the plasma process is an anisotropic etching process wherein determining the pre-determined plasma processing time recipe comprises determining plasma process parameters including at least an RF power and plasma processing time required to complete at least one plasma processing step.

10. The method of claim 6, wherein the step of resuming the aborted plasma process comprises retrieving the pre-process plasma process system parameters from the selectively queryable database and re-setting the plasma processing system to pre-process conditions.

11. The method of claim 7, wherein determining the iterative plasma process parameter adjustment recipe comprises;
   retrieving the plasma processing history including at least one plasma species emission spectra from the selectively queryable database;
   retrieving a model plasma process history;
   determining a difference between the model plasma process history and the plasma process; and,
   determining adjustments to the plasma processing parameters required to approximate the model plasma process history.

12. A method for recovering from an aborted plasma etch process comprising the steps of:
   beginning a semiconductor wafer plasma etch process in a plasma processing system according to a first plasma etch process recipe including plasma etch process recipe steps;

collecting plasma etch process parameters comprising at least an RF power and a plasma etch process time at pre-determined time intervals;

storing the plasma etch process parameters including pre-process plasma processing system parameters according to a selectively queryable database to create a plasma etch process history;

determining whether the plasma etch process has been aborted;

upon determining an aborted plasma etch process selectively retrieving from the selectively queryable database the plasma etch process history to determine a second plasma etch process recipe; and, resuming the aborted plasma etch process to complete the plasma etch process according to the second plasma etch process recipe.

13. The method of claim 12, wherein the plasma etch process parameters further comprise at least one of RF frequency, plasma chamber pressure, semiconductor wafer temperature, RF bias, plasma source gas flow rates, electrode position, and plasma species emission spectra.

14. The method of claim 12, wherein the step of storing the plasma etch process parameters comprises storing the plasma etch process parameters associated with an identifiable plasma etch process system and an identifiable plasma etch process recipe including a plasma etch process recipe step.

15. The method of claim 12, wherein the pre-determined time interval is from about 0.5 seconds to about 30 seconds.

16. The method of claim 12, wherein the step of selectively retrieving comprises determining the plasma etch process history comprising at least an RF power and a process time.

17. The method of claim 12, wherein the second plasma etch process recipe comprises determining a processing time at an RF power required to complete a plasma process recipe step.

18. The method of claim 12, wherein the step of resuming the plasma process comprises retrieving pre-process plasma processing system parameters from the selectively queryable database to restore the plasma processing system to pre-process conditions.

19. The method of claim 12, wherein the step of storing includes storing in computer readable media included in a server remotely located from the plasma processing system including a backup power supply.

20. The method of claim 12, wherein the plasma etch process recipe comprises an iterative plasma process parameter adjustment recipe adjusted in response to at least one plasma species concentration.

* * * * *